United States Patent
Lee et al.

(10) Patent No.: US 8,928,398 B2
(45) Date of Patent: Jan. 6, 2015

(54) DIFFERENTIAL ANALOG SIGNAL PROCESSING STAGE WITH REDUCED EVEN ORDER HARMONIC DISTORTION

(71) Applicant: Texas Instruments Incorporated, Dallas, TX (US)

(72) Inventors: Bumha Lee, Pleasanton, CA (US); Yongseon Koh, Palo Alto, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/874,389

(22) Filed: Apr. 30, 2013

(65) Prior Publication Data

US 2014/0320191 A1    Oct. 30, 2014

(51) Int. Cl.
| | |
|---|---|
| H03B 1/00 | (2006.01) |
| H03K 5/00 | (2006.01) |
| H04B 1/00 | (2006.01) |
| H02J 3/01 | (2006.01) |

(52) U.S. Cl.
CPC ....................................... *H02J 3/01* (2013.01)

USPC ........... 327/551; 327/331; 327/332; 327/552; 330/9; 330/69; 330/84; 341/118; 341/119

(58) Field of Classification Search
CPC . H03H 11/0422; H03K 17/00; H03K 17/002; H03M 1/66; H03G 11/008
USPC .......... 327/331, 332, 551, 552; 330/9, 69, 84; 341/118, 119
See application file for complete search history.

(56) References Cited

U.S. PATENT DOCUMENTS

| | | | |
|---|---|---|---|
| 7,928,871 B2 * | 4/2011 | Aruga et al. ................... | 341/118 |
| 2011/0001542 A1 * | 1/2011 | Ranta et al. ................... | 327/382 |

* cited by examiner

*Primary Examiner* — John Poos
(74) *Attorney, Agent, or Firm* — Alan A. R. Cooper; Frederick J. Telecky, Jr.

(57) ABSTRACT

The even order harmonic distortion in a differential circuit is reduced or eliminated by treating the amplitude and phase mismatch sources that cause the distortion as impedance mismatches, and utilizing switched resistor circuitry that adjusts the load resistance to reduce the effects of the amplitude mismatch sources, and switched capacitor circuitry that adds shunt capacitance to reduce the effects of the phase mismatch sources.

20 Claims, 3 Drawing Sheets

DIFFERENTIAL ANALOG SIGNAL PROCESSING STAGE WITH REDUCED EVEN ORDER HARMONIC DISTORTION

BACKGROUND OF THE INVENTION

1. Field of the Invention

The present invention relates to analog signal processing stages and, more particularly, to a differential analog signal processing stage with reduced even order harmonic distortion.

2. Description of the Related Art

An analog-to-digital converter (ADC) is an electronic circuit that converts an analog input signal into a corresponding digital code that represents the magnitude of the analog input signal. ADCs commonly include a switched capacitor circuit that includes a first switch, a capacitor with a first plate that is connected to the first switch, and a second switch that is connected to a second plate of the capacitor.

In operation, the first switch and the second switch close simultaneously, while the second switch opens right before the first switch opens to minimize signal dependent distortion that is introduced by the switching. When the first and second switches close, a differential analog signal processing stage drives a voltage onto the capacitor that represents the magnitude of the analog input signal at the input to the differential analog signal processing stage. The voltage on the capacitor is sampled the moment the second switch opens. The sampled voltage is then sensed and converted into a digital value.

Differential signal processing is widely used in high-performance analog signal path design to improve the common mode rejection ratio and increase the analog signal dynamic range by two times (at the expense of increased power consumption). An analog signal is single-ended by nature, and has to be converted into a differential signal at some point on the analog signal path. An early conversion of the analog signal into the differential signal is preferred for high performance.

A differential analog signal processing stage includes a single-to-differential amplifier, an anti-aliasing filter that is connected to the single-to-differential amplifier, and a pseudo differential amplifier that is connected to the anti-aliasing filter. The single-to-differential amplifier outputs a positive differential signal and a negative differential signal in response to the analog input signal.

The positive and negative differential signals are filtered by the anti-aliasing filter. The pseudo differential amplifier drives the filtered positive and negative differential signals out to the differential switched capacitor circuit. The pseudo differential amplifier commonly utilizes a first source/emitter-follower amplifier to drive the filtered positive differential signal, and a second source/emitter-follower amplifier to drive the filtered negative differential signal.

One of the drawbacks to using a switched capacitor circuit is that the operation of the switched capacitor circuit inevitably introduces a significant amount of switching noise into the differential analog signal processing stage. One approach to reducing the switching noise is to use an internal amplification stage that outputs differential signals to a differential switched capacitor circuit. An internal differential amplification stage eases the entire analog signal processing path design.

The differential switched capacitor circuit includes a positive switched capacitor circuit (a first switch, a capacitor, and a second switch) that is connected to receive the positive differential signal output by the first source/emitter-follower amplifier, and a negative switched capacitor circuit (a first switch, a capacitor, and a second switch) that is connected to receive the negative differential signal output by the second source/emitter-follower amplifier.

Although the differential analog signal processing stage substantially reduces even order harmonic distortion, amplitude and phase mismatches along the positive and negative signal paths introduce a substantial amount of even order harmonic distortion. Thus, there is a need for an approach to reduce the even order harmonic distortion in a differential analog signal processing stage.

SUMMARY OF THE INVENTION

The present invention provides a differential analog signal processing stage that reduces the effects of amplitude and phase mismatch sources, thereby reducing even order harmonic distortion. The differential analog signal processing stage of the present invention includes a plurality of resistors that are connected in series. A first resistor in the series is connected to a positive path node, while a last resistor in the series is connected to a negative path node. The differential analog signal processing stage also includes a plurality of resistor switches that are connected to the plurality of resistors such that each resistor switch is connected to two adjacent resistors in the series. The differential analog signal processing stage further includes a plurality of positive capacitor circuits that are each connected to the positive path node and ground. Each positive capacitor circuit has a positive capacitor and a positive switch connected to the positive capacitor. The differential analog signal processing stage additionally includes a plurality of negative capacitor circuits that are each connected to the negative path node and ground. Each negative capacitor circuit has a negative capacitor and a negative switch connected to the negative capacitor. Further, the differential analog signal processing stage includes a control circuit that is connected to each resistor switch, each positive switch, and each negative switch. The control circuit outputs signals that individually open and close each resistor switch, each positive switch, and each negative switch.

The present invention also includes a method of configuring a differential circuit. The method of the present invention includes selecting a resistor-capacitor switch combination from a plurality of possible resistor-capacitor switch combinations. Each resistor-capacitor switch combination identifies a number of switches from a plurality of switches. The method of the present invention also includes closing only the switches that are identified by the resistor-capacitor switch combination, inputting an analog input signal into the differential circuit, and determining a second harmonic distortion value from a processed signal that is output by the differential circuit in response to the analog input signal.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 1:
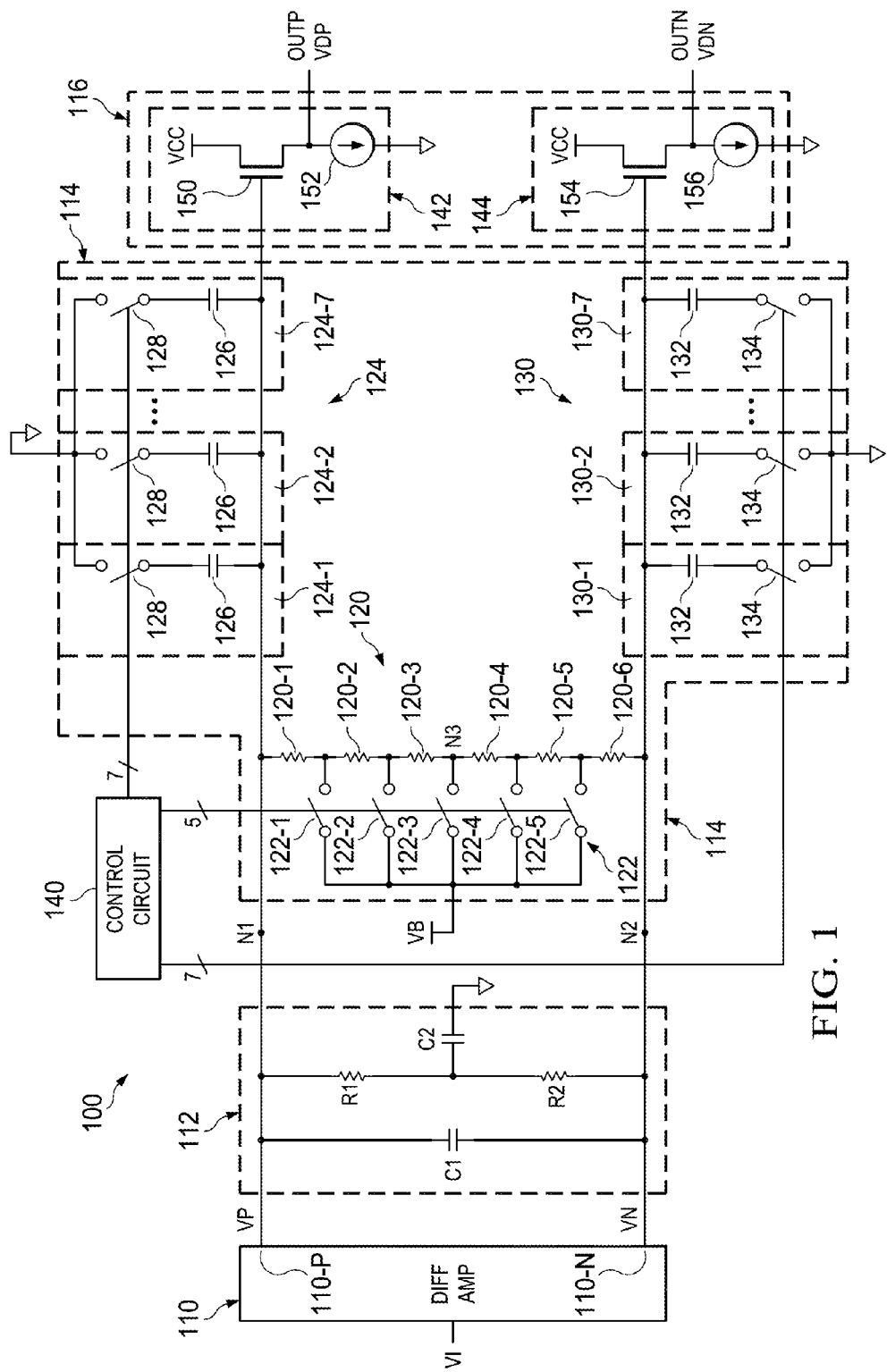
FIG. 1 is a schematic diagram illustrating an example of a differential analog signal processing stage 100 in accordance with the present invention.

FIG. 1 shows a schematic diagram that illustrates an example of a differential analog signal processing stage 100 in accordance with the present invention. The present invention treats amplitude and phase mismatch sources as impedance mismatches, and reduces the effects of the amplitude mismatch sources by including circuitry that adjusts the load resistance, and the effects of the phase mismatch sources by including circuitry that adds shunt capacitance. Reducing the effects of the amplitude and phase mismatch sources reduces the even order harmonic distortion.

As shown in FIG. 1, differential analog signal processing stage 100 includes a single-to-differential amplifier 110, and a differential anti-aliasing filter 112 that is connected to single-to-differential amplifier 110. Differential analog signal processing stage 100 also includes a differential compensation circuit 114 that is connected to anti-aliasing filter 112, and a pseudo differential amplifier 116 that is connected to differential compensation circuit 114.

Single-to-differential amplifier 110 outputs a positive differential signal VP and a negative differential signal VN in response to an analog input signal VI. The positive differential signal VP is output from a positive differential output 110-P that is connected to a positive path node N1, while the negative differential signal VN is output from a negative differential output 110-N that is connected to a negative path node N2.

Differential anti-aliasing filter 112 removes out-of-band noise and distortion from the positive differential signal VP and the negative differential signal VN. Differential compensation circuit 114 adjusts the filtered positive and negative differential signals as needed to reduce the effects of the amplitude and phase mismatch sources. Pseudo differential amplifier 116 then drives the adjusted positive and negative differential signals.

Single-to-differential amplifier 110 can be implemented in a conventional manner. Anti-aliasing filter 112 can also be implemented in a conventional manner. In the present example, a first-order anti-aliasing filter 112 includes a capacitor C1 that is connected to the positive path node N1 and the negative path node N2, and a pair of resistors R1 and R2 that are connected in series between the positive path node N1 and the negative path node N2. A capacitor C2 is connected to resistor R1, resistor R2, and ground. The capacitor C2 has a low impedance point at high frequency and provides a firm common mode level.

Differential compensation circuit 114 includes a number of resistors 120 that are connected in series. A first resistor 120 in the series is connected to the positive path node N1, while a last resistor 120 in the series is connected to the negative path node N2. Further, the total resistance between a middle resistor node N3 and the positive path node N1 and the total resistance between the middle resistor node N3 and the negative path node N2 are substantially equal.

In the present example, six resistors 120-1 through 120-6 are connected in series. First resistor 120-1, which is connected to the positive path node N1, and last resistor 120-6, which is connected to the negative path node N2, are substantially equal. In addition, resistor 120-2 and resistor 120-5 are substantially equal and, in the present example, different from the resistors 120-1 and 120-6.

Further, resistor 120-3 and resistor 120-4 are substantially equal and, in the present example, different from the resistors 120-1 and 120-6 and the resistors 120-2 and 120-5. As a result, the total resistance between the middle resistor node N3 and the positive path node N1 and the total resistance between the middle resistor node N3 and the negative path node N2 are substantially equal.

Differential compensation circuit 114 also includes a number of resistor switches 122 that are connected to the resistors 120. Each resistor switch 122 is connected to two adjacent resistors 120 in the series. Each resistor switch 122 is also connected to receive a common mode bias voltage VB.

In the present example, five resistor switches 122-1 through 122-5 are connected to the resistors 120-1 through 120-6. Resistor switch 122-1 is connected to resistors 120-1 and 120-2, while resistor switch 122-2 is connected to resistors 120-2 and 120-3. Further, resistor switch 122-3 is connected to the middle resistor node N3 and resistors 120-3 and 120-4. In addition, resistor switch 122-4 is connected to resistors 120-4 and 120-5, while resistor switch 122-5 is connected to resistors 120-5 and 120-6.

The differential impedance is defined as the impedance between the positive path node N1 and the negative path node N2, while the single-ended impedance of the positive path node N1 is defined as the impedance between the node N1 to the common mode bias voltage VB and the single-ended impedance of the negative node N2 is defined as the impedance between the node N2 and the common mode bias voltage VB.

When resistor switch 122-3 is closed, the common mode bias voltage VB is connected to the middle resistor node N3. When resistor switch 122-3 is opened and one of the other resistor switches 122 is closed, the connection to the common mode bias voltage VB moves which, in turn, increases the single-ended impedance of one polarity and decreases the single-ended impedance of the other polarity, while the differential impedance is not affected.

Differential compensation circuit 114 further includes a number of positive capacitor circuits 124 that are each connected to the positive path node N1 and ground. In the present example, seven positive capacitor circuits 124-1 through 124-7 are connected to the positive path node N1 and ground. Each positive capacitor circuit 124, in turn, has a capacitor 126 and a capacitor switch 128 that is connected to capacitor 126.

In addition, differential compensation circuit 114 includes a number of negative capacitor circuits 130 that are each connected to the negative path node N2 and ground. In the present example, seven negative capacitor circuits 130-1 through 130-7 are connected to the negative path node N2 and ground. Each negative capacitor circuit 130, in turn, has a capacitor 132 and a capacitor switch 134 that is connected to capacitor 132.

Further, differential compensation circuit 114 includes a control circuit 140 that is connected to the resistor switches 122, the switches 128 in the positive capacitor circuits 124, and the switches 134 in the negative capacitor circuits 130. Control circuit 140 controls which one of the resistor switches 122 is closed, and which, if any, of the switches 128 in the positive capacitor circuits 124 and the switches 134 in the negative capacitor circuits 130 are closed.

Pseudo differential amplifier 116 can be implemented in a conventional manner with a source-follower amplifier 142 that is connected to the positive path node N1, and a source-follower amplifier 144 that is connected to the negative path node N2. Source-follower amplifier 142 outputs a positive differential signal VDP to a positive output node OUTP, while source-follower amplifier 144 outputs a negative differential signal VDN to a negative output node OUTN.

In the present example, source-follower amplifier 142 has a MOS transistor 150 and a current source 152. MOS transistor 150 has a drain connected to a power supply voltage VCC, a gate connected to the positive path node N1, and a source connected to current source 152 and the positive output node OUTP.

In addition, source-follower amplifier 144 has a MOS transistor 154 and a current source 156. MOS transistor 154 has a drain connected to the power supply voltage VCC, a gate connected to the negative path node N2, and a source connected to current source 156 and the negative output node OUTN.

Figure 2:
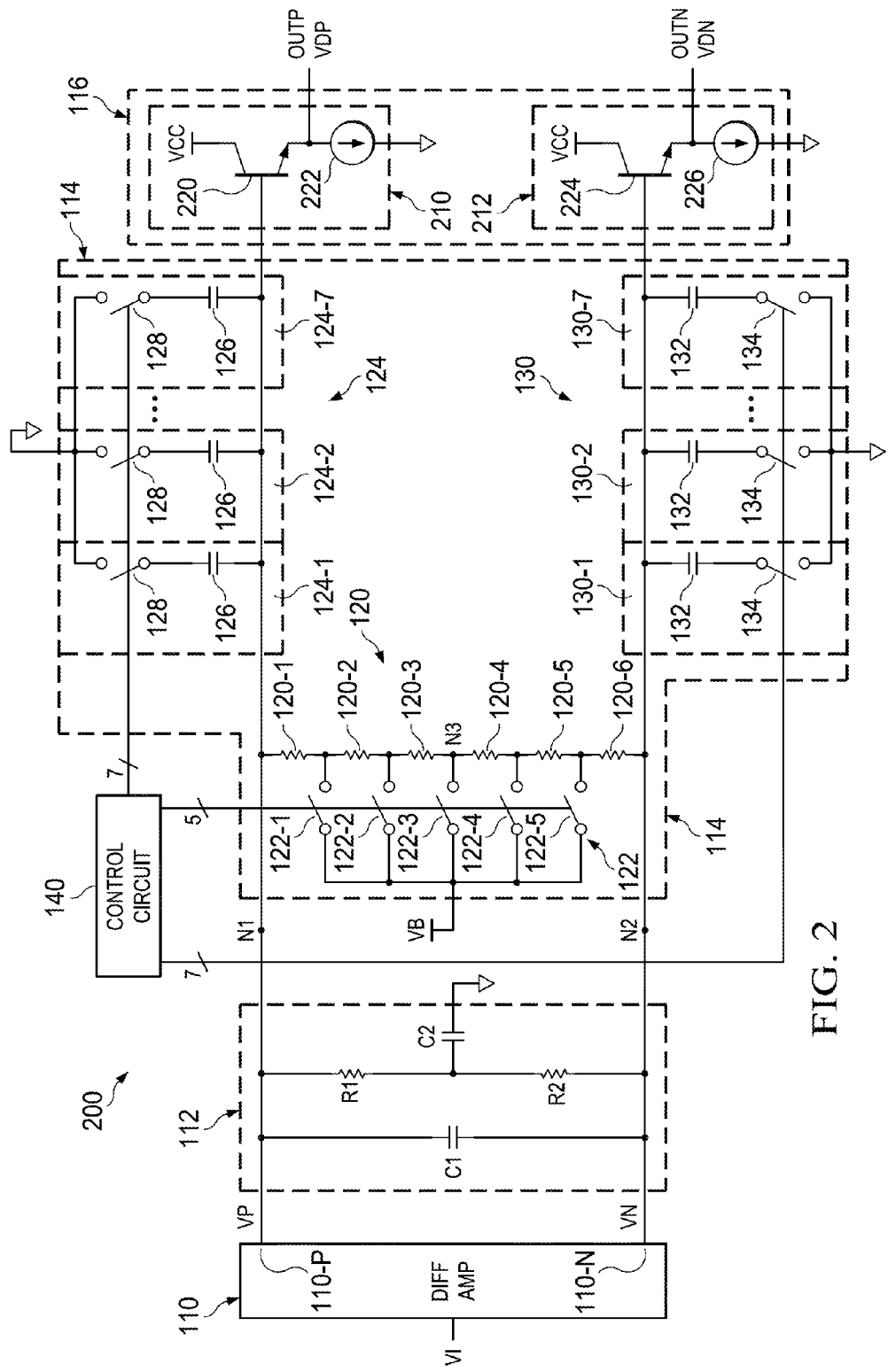
FIG. 2 is a schematic diagram illustrating an example of a differential analog signal processing stage 200 in accordance with an alternate embodiment of the present invention.

Rather than using source-follower amplifiers to implement pseudo differential amplifier 116, emitter-follower amplifiers can alternately be used. FIG. 2 shows a schematic diagram that illustrates an example of a differential analog signal processing stage 200 in accordance with an alternate embodiment of the present invention. Differential analog signal processing stage 200 is similar to differential analog signal processing stage 100 and, as a result, utilizes the same reference numerals to designate the elements that are common to both stages.

As shown in FIG. 2, differential analog signal processing stage 200 is the same as differential analog signal processing stage 100, except that pseudo differential amplifier 116 is implemented in a conventional manner with an emitter-follower amplifier 210 that is connected to the positive path node N1, and an emitter-follower amplifier 212 that is connected to the negative path node N2. Emitter-follower amplifier 210 outputs the positive differential signal VDP to the positive output node OUTP, while emitter-follower amplifier 212 outputs the negative differential signal VDN to the negative output node OUTN.

In the present example, emitter-follower amplifier 210 has a bipolar transistor 220 and a current source 222. Bipolar transistor 220 has a collector connected to the power supply voltage VCC, a base connected to the positive path node N1, and an emitter connected to current source 222 and the positive output node OUTP.

In addition, emitter-follower amplifier 212 has a bipolar transistor 224 and a current source 226. Bipolar transistor 224 has a collector connected to the power supply voltage VCC, a base connected to the negative path node N2, and an emitter connected to current source 226 and the negative output node OUTN.

The differential analog signal processing stages 100 and 200 provide amplified differential signals to a differential subsystem, such as a differential analog-to-digital (ADC) converter. Like the differential analog signal processing stages 100 and 200, the differential subsystem also has amplitude and phase mismatch sources along the positive and negative signal paths. Thus, amplitude and phase mismatch sources are introduced by the differential analog signal processing stages 100 and 200 as well as the differential subsystem.

Figure 3:
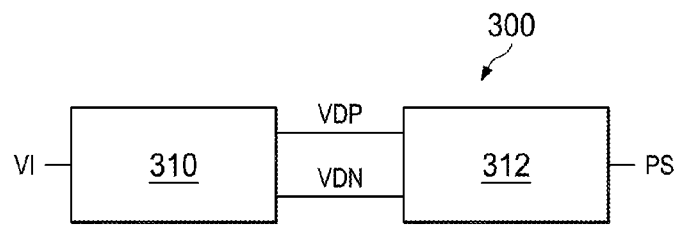
FIG. 3 is a block diagram that illustrates an example of a differential circuit 300 in accordance with the present invention.

FIG. 3 shows a block diagram that illustrates an example of a differential circuit 300 in accordance with the present invention. As shown in FIG. 3, differential circuit 300 includes a differential analog signal processing stage 310 that receives a single-ended analog input signal VI, and outputs a positive differential signal VDP and a negative differential signal VDN in response to the single-ended analog input signal VI. Differential analog signal processing stage 310 can be implemented with, for example, differential analog signal processing stage 100 or differential analog signal processing stage 200.

As further shown in FIG. 3, differential circuit 300 includes a differential subsystem 312 that receives the positive differential signal VDP and the negative differential signal VDN, and outputs a processed signal PS in response to the positive differential signal VDP and the negative differential signal VDN. For example, differential subsystem 312 can be implemented as an ADC that outputs the processed signal PS as a digital code.

Differential circuit 300 is configured to reduce or eliminate the second harmonic distortion by identifying a resistor-capacitor switch combination that minimizes the effects of the amplitude and phase mismatch sources in both differential analog signal processing stage 310 and differential subsystem 312.

A resistor-capacitor switch combination identifies the switches 122, 128, and 134 that are to be closed, and includes one of the resistor switches 122 and either none, one, or more than one of the capacitor switches 128 and 134. Once the resistor switch 122 and the none, one, or more than one capacitor switches 128 and 134 have been identified, the identified resistor and capacitor switches 122, 128, and 134 are closed to complete the configuration.

Figure 4:
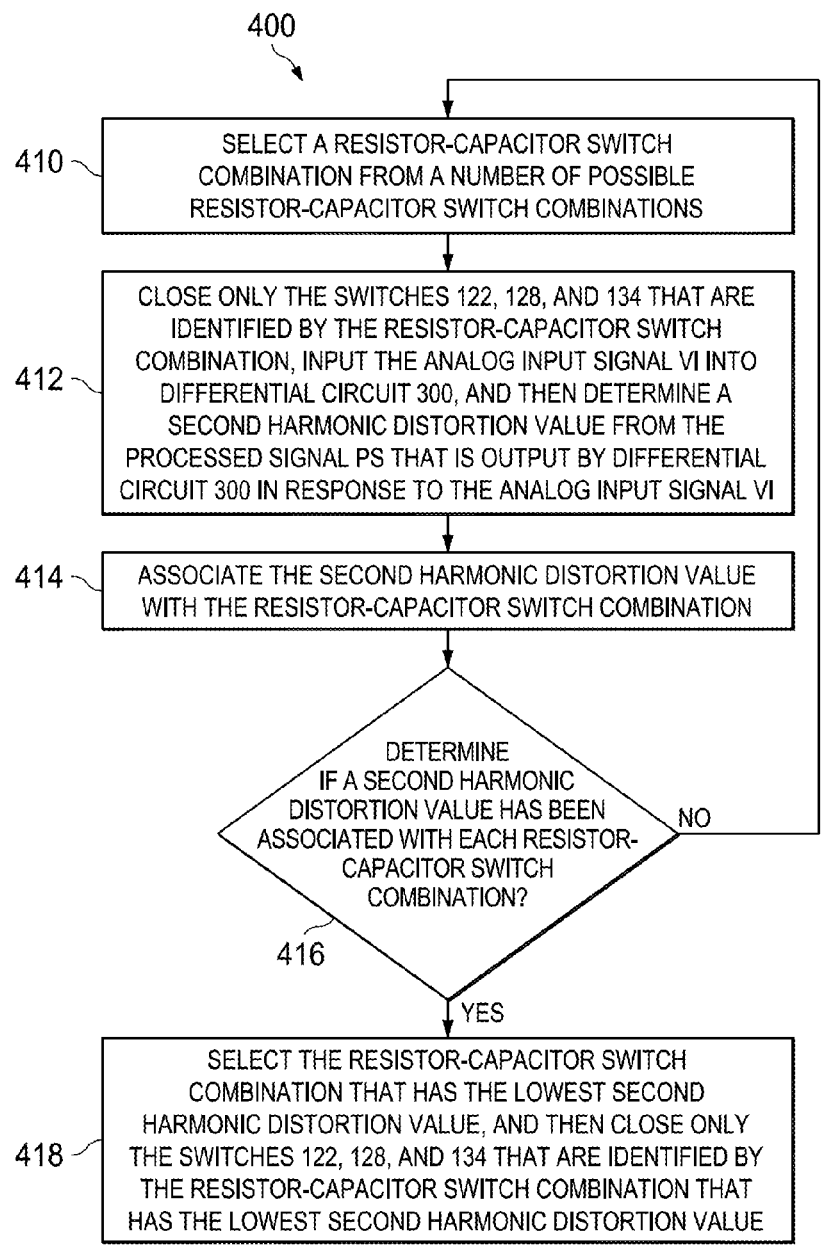
FIG. 4 is a flow chart illustrating an example of a method 400 of configuring differential circuit 300 in accordance with the present invention.

FIG. 4 shows a flow chart that illustrates an example of a method 400 of configuring differential circuit 300 in accordance with the present invention. As shown in FIG. 4, method 400 begins in step 410 by selecting a first resistor-capacitor switch combination from a number of possible resistor-capacitor switch combinations. The number of possible resistor-capacitor switch combinations can include all possible combinations, or a smaller set of possible combinations.

Each resistor-capacitor switch combination identifies a number of switches 122, 128, and 134 that include a resistor switch 122 and none, one, or more than one capacitor switches 128 and 134. For example, the first resistor-capacitor switch combination can include resistor switch 122-3 and none of the capacitor switches 128 and 134.

Method 400 next moves to step 412 to close only the switches 122, 128, and 134 that are identified by the first resistor-capacitor switch combination, input the analog input signal VI into differential circuit 300 (by inputting the analog input signal VI into differential analog signal processing stage 310), and then determine a second harmonic distortion value from the processed signal PS that is output by differential circuit 300 in response to the analog input signal VI (by determining a second harmonic distortion value from the processed signal PS that is output by differential subsystem 312 in response to the analog input signal VI).

For example, when differential subsystem 312 is implemented as an ADC, the digital code output by the ADC is evaluated to determine the second harmonic distortion value. Once the second harmonic distortion value has been determined, method 400 moves to step 414 to associate the second harmonic distortion value with the first resistor-capacitor switch combination, and then to step 416 to determine if a second harmonic distortion value has been associated with each resistor-capacitor switch combination.

When a second harmonic distortion value has not been associated with each resistor-capacitor switch combination, method 400 returns to step 410 to select a second resistor-capacitor switch combination. For example, the second resistor-capacitor switch combination can include resistor switch 122-3 and the capacitor switch 128 in positive capacitor circuit 124-1.

Method 400 next moves to step 412 to close only the switches 122, 128, and 134 that are identified by the second resistor-capacitor switch combination, input the analog input signal VI into differential circuit 300, and again determine a second harmonic distortion value from the processed signal PS that is output by differential circuit 300 in response to the analog input signal VI. Once the second harmonic distortion value has been determined, method 400 moves to step 414 to associate the second harmonic distortion value with the second resistor-capacitor switch combination.

The process continues in a similar manner until a second harmonic distortion value has been associated with each resistor-capacitor switch combination. When a second harmonic distortion value has been associated with each resistor-capacitor switch combination in step 416, method 400 moves to step 418.

In step 418, method 400 selects the resistor-capacitor switch combination that has the lowest second harmonic distortion value, and then closes only the switches 122, 128, and 134 that are identified by the resistor-capacitor switch combination that has the lowest second harmonic distortion value. The resistor-capacitor switch combination that has the lowest second harmonic distortion value minimizes or eliminates the second harmonic distortion in the processed signal PS that is output from differential circuit 300.

Thus, one of the advantages of the present invention is that differential compensation circuit 114 reduces or eliminates the effects of the amplitude and phase mismatch sources that are introduced by differential analog signal processing stage 310 as well as the effects of the amplitude and phase mismatch sources that are introduced by differential subsystem 312.

For example, when differential subsystem 312 is an ADC, the second harmonic distortion in the digital code output by the ADC can be reduced or eliminated. As a result, differential analog signal processing stage 310 compensates for the effects of the amplitude and phase mismatch sources in all of differential circuit 300.

The differential analog signal processing stage 310 of the present invention is factory or customer configurable to identify and close the resistor switch 112 and the none, one, or more than one of the capacitor switches 128 and 134 that minimize the amplitude and phase differences between the positive differential signal and the negative differential signal.

One of the advantages of the present invention is that by treating the amplitude and phase mismatch sources as impedance mismatches, such that the amplitude mismatches can be minimized by changing the load resistance and the phase mismatches can be minimized by adding shunt capacitance, the present invention provides implementation simplicity as well as an effective solution for wideband analog signal processing applications.

If the impedance mismatch is due to inductive sources but is compensated with capacitance, then the improvement is over a limited frequency range. If resistive and capacitive impedance mismatch dominates the amplitude and phase mismatch, then the improvement is over a wide frequency range.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A differential analog signal processing stage comprising:
    a plurality of resistors connected in series, a first resistor in the series being connected to a positive path node, a last resistor in the series being connected to a negative path node;
    a plurality of resistor switches that are connected to the plurality of resistors such that each resistor switch is connected to two adjacent resistors in the series;
    a plurality of positive capacitor circuits that are each connected to the positive path node and ground, each positive capacitor circuit having a positive capacitor and a positive switch connected to the positive capacitor;
    a plurality of negative capacitor circuits that are each connected to the negative path node and ground, each negative capacitor circuit having a negative capacitor and a negative switch connected to the negative capacitor; and
    a control circuit connected to each resistor switch, each positive switch, and each negative switch, the control circuit outputting signals that individually open and close each resistor switch, each positive switch, and each negative switch,
    wherein each resistor switch is connected to receive a bias voltage.

2. The differential analog signal processing stage of claim 1 wherein only one resistor switch is closed at a time.

3. The differential analog signal processing stage of claim 2 wherein:
    a resistor node lies between adjacent resistors in the series of resistors; and
    a total resistance between the resistor node and the positive path node and a total resistance between the resistor node and the negative path node are substantially equal.

4. The differential analog signal processing stage of claim 3 wherein a first resistor in the series and a last resistor in the series have substantially equal resistances.

5. The differential analog signal processing stage of claim 1 and further comprising a pseudo differential amplifier connected to the positive path node and the negative path node.

6. The differential analog signal processing stage of claim 5 wherein the pseudo differential amplifier includes:
    a first source-follower amplifier connected to the positive path node; and
    a second source-follower amplifier connected to the negative path node.

7. The differential analog signal processing stage of claim 5 wherein the pseudo differential amplifier includes:
    a first emitter-follower amplifier connected to the positive path node; and
    a second emitter-follower amplifier connected to the negative path node.

8. The differential analog signal processing stage of claim 5 and further comprising an anti-aliasing filter connected to the positive path node and the negative path node, the anti-aliasing filter removing out-of-band noise and distortion.

9. The differential analog signal processing stage of claim 8 and further comprising a differential amplifier that outputs a positive differential signal from a positive differential output that is connected to the positive path node, and a negative differential signal from a negative differential output that is connected to the negative path node.

10. A method of configuring a differential circuit, the method comprising:
    selecting a resistor-capacitor switch combination from a plurality of possible resistor-capacitor switch combinations, each resistor-capacitor switch combination identifying a number of switches from a plurality of switches;

closing only the switches that are identified by the resistor-capacitor switch combination, inputting an analog input signal into the differential circuit, and determining a second harmonic distortion value from a processed signal that is output by the differential circuit in response to the analog input signal.

11. The method of claim 10 and further comprising:
associating the second harmonic distortion value with the resistor-capacitor switch combination; and
determining if a second harmonic distortion value has been associated with each resistor-capacitor switch combination.

12. The method of claim 11 and further comprising continuing to select resistor-capacitor switch combinations, close only the switches that are identified by the resistor-capacitor switch combinations, input an analog input signal into the differential circuit, determine second harmonic distortion values for the resistor-capacitor switch combinations, and associate the second harmonic distortion values with the resistor-capacitor switch combinations until a second harmonic distortion value has been associated with each resistor-capacitor switch combination.

13. The method of claim 12 wherein the plurality of switches includes a plurality of resistor switches that are connected to a plurality of resistors so that each resistor switch is connected to a number of resistors of the plurality of resistors.

14. The method of claim 13 wherein the plurality of resistors are connected in series, a first resistor of the series being connected to a positive path node, a last resistor of the series being connected to a negative path node.

15. The method of claim 14 wherein each resistor switch is connected to a bias voltage.

16. The method of claim 14 wherein the plurality of switches further includes a plurality of positive switches and a plurality of negative switches, each positive switch being connected to a corresponding positive capacitor of a plurality of positive capacitors, each negative switch being connected to a corresponding negative capacitor of a plurality of negative capacitors.

17. The method of claim 16 wherein:
each positive switch and the corresponding positive capacitor form a positive switch circuit, each positive switch circuit being connected to the positive path node and ground; and
each negative switch and the corresponding negative capacitor form a negative switch circuit, each negative switch circuit being connected to the negative path node and ground.

18. The method of claim 17 wherein:
the positive path node is connected to a first source-follower transistor; and
the negative path node is connected to a second source-follower transistor.

19. The method of claim 17 wherein:
the positive path node is connected to a first emitter-follower transistor; and
the negative path node is connected to a second emitter-follower transistor.

20. An apparatus that configures a differential circuit, the apparatus comprising:
means for selecting a resistor-capacitor switch combination from a plurality of possible resistor-capacitor switch combinations, each resistor-capacitor switch combination identifying a number of switches from a plurality of switches;
means for closing only the switches that are identified by the resistor-capacitor switch combination, inputting an analog input signal into the differential circuit, and determining a second harmonic distortion value from a processed signal that is output by the differential circuit in response to the analog input signal.

* * * * *